(12) United States Patent
Gao

(10) Patent No.: US 11,723,176 B2
(45) Date of Patent: Aug. 8, 2023

(54) MULTI-TIER COOLING SYSTEM WITHOUT LOAD PERCEPTION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 52 days.

(21) Appl. No.: 17/354,854

(22) Filed: Jun. 22, 2021

(65) Prior Publication Data

US 2022/0408602 A1 Dec. 22, 2022

(51) Int. Cl.
*G06F 1/20* (2006.01)
*H05K 7/20* (2006.01)

(52) U.S. Cl.
CPC ......... *H05K 7/20381* (2013.01); *G06F 1/206* (2013.01)

(58) Field of Classification Search
CPC ....................................................... G06F 1/206
See application file for complete search history.

(56) References Cited

U.S. PATENT DOCUMENTS

| 2014/0000300 | A1* | 1/2014 | Ito | F24F 11/84 62/119 |
| 2014/0316605 | A1* | 10/2014 | Conan | G05D 23/30 700/300 |
| 2016/0120065 | A1* | 4/2016 | Shedd | F28F 9/26 165/104.29 |
| 2017/0280590 | A1* | 9/2017 | Chiba | H05K 7/20318 |
| 2017/0325355 | A1* | 11/2017 | Lau | H05K 7/20318 |
| 2019/0110379 | A1* | 4/2019 | Cui | G06F 1/206 |
| 2021/0368656 | A1* | 11/2021 | Heydari | H05K 7/20836 |

FOREIGN PATENT DOCUMENTS

CN 108289399 A * 7/2018 ......... H05K 7/20736

* cited by examiner

*Primary Examiner* — Suresh Suryawanshi
(74) *Attorney, Agent, or Firm* — Womble Bond Dickinson (US) LLP

(57) ABSTRACT

The disclosed embodiments provide a cooling system with an auxiliary system that extends a main system. The auxiliary system includes a vapor container that receives vapor from the IT load, an auxiliary condenser that receives vapor from the vapor container via a compressor or a vapor valve, and condenses the vapor into liquid to be stored in a liquid container. The auxiliary system further includes a fluid pump on a cooling loop for cooling the auxiliary condenser, and a cooling controller that includes a machine learning model for regulating operations of the vapor valve, the fluid pump, and the first compressor based on a pre-created profile of the IT load and real-time information from at least one of many sources, including the vapor container and the liquid container. The auxiliary system includes multiple cooling tiers that can be partially trigger or completely trigger based on several indicators collected multiple sensors in the auxiliary system.

20 Claims, 4 Drawing Sheets

MULTI-TIER COOLING SYSTEM WITHOUT LOAD PERCEPTION

FIELD OF THE INVENTION

Embodiments of the present disclosure relate generally to cooling systems. More particularly, embodiments of the disclosure relate to a server rack cooling system with multi-level cooling capacities.

BACKGROUND

An efficient thermal management solution can reduce cooling cost for a server rack in a data center. For a thermal management solution to be efficient, it should satisfy the rack power consumption at all time with a minimum cooling capacity buffer, can be self-regulating with the change of the power consumption in the server rack, can have a hardware design that is flexible enough to accommodate the ever changing IT requirements, and can support a phase change cooling system.

However, for existing thermal management solutions, an IT load to be cooled is typically tightly coupled with the cooling layer. This type of systems lack flexibility because any change in the IT load requires corresponding changes in the cooling layer.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
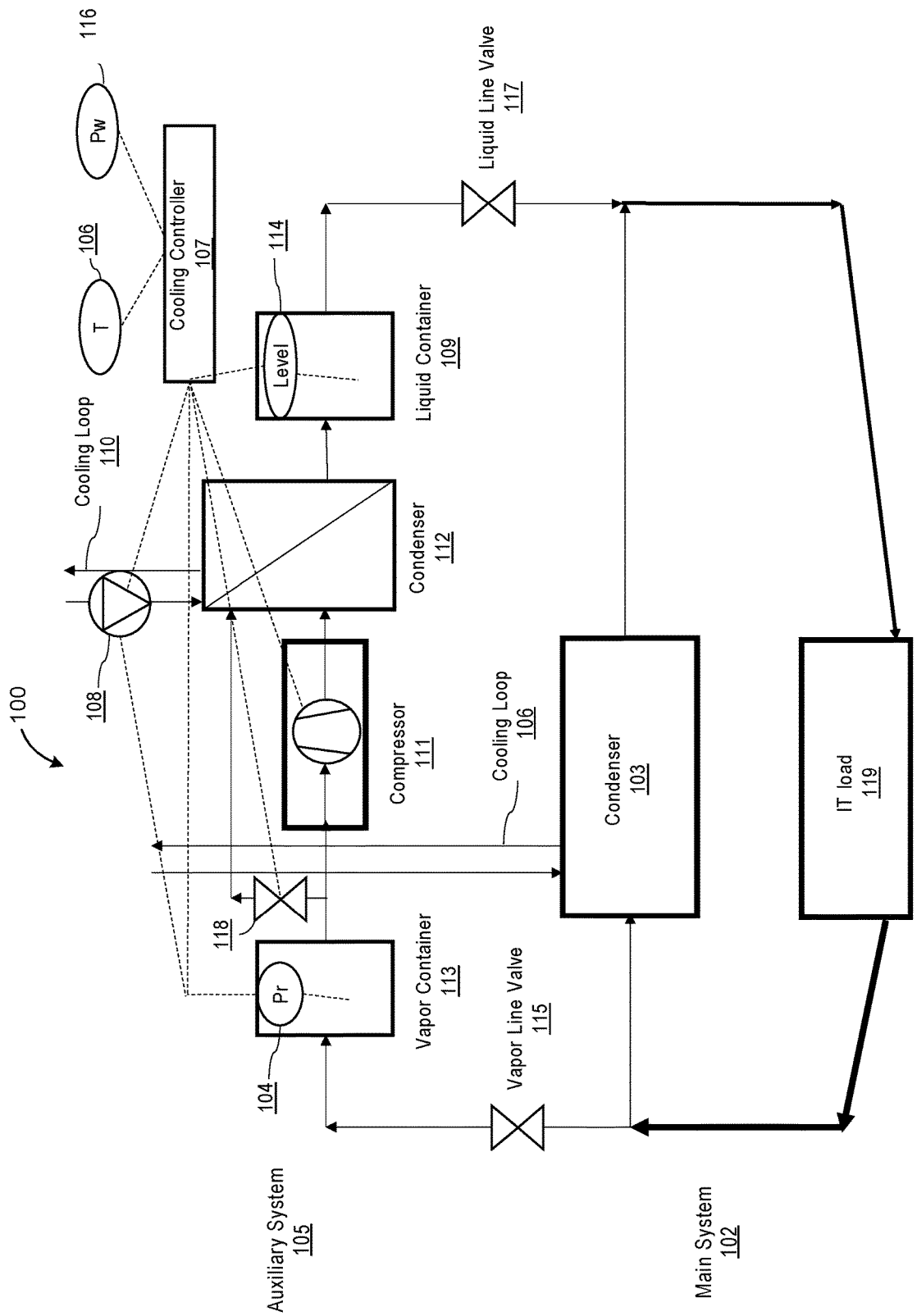
FIG. 1 shows a multi-tier cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, the disclosure describes systems for cooling an information technology (IT) load. The cooling systems have no perception of the real-time variations of the IT load, but instead use a machine learning model to regulate operations of cooling tiers based on a pre-created profile of the IT load and real-time information collected from several sensors.

In one embodiment, a cooling system includes an auxiliary system that is positioned above an IT load. The auxiliary system includes a vapor container that receives vapor from the IT load, an auxiliary condenser that receives vapor from the vapor container via a compressor or a vapor valve, and condenses the vapor into liquid to be stored in a liquid container. The auxiliary system further includes a fluid pump on a cooling loop for cooling the auxiliary condenser, and a cooling controller that includes a machine learning model for regulating operations of the vapor valve, the fluid pump, and the first compressor based on a pre-created profile of the IT load and real-time information from at least one of many sources and actual design data including the vapor container and the liquid container.

In one embodiment, the auxiliary system includes multiple cooling tiers that can be partially triggered or completely triggered based on several indicators, including a pressure level in the vapor container, a fluid level in the liquid container, an ambient temperature, and/or availability level of a renewable energy source for powering the auxiliary condenser. The multiple cooling tiers represent connections in the auxiliary system, including a connection from the vapor container to the compressor, and then to the auxiliary condenser; a connection from the vapor container to a vapor valve, and then to the auxiliary condenser; a cooling loop with a fluid pump for cooling the condenser; and an intersystem connection that connects the auxiliary system to another auxiliary system.

In one embodiment, the operations of the key devices in the cooling tiers can be adjusted. For example, the speed of the fluid pump can be increased to cool the auxiliary condenser faster, the frequency of the compressor can be increased to compress vapor more efficiently, and the opening of the vapor valve can be increased to allow more vapor to pass through.

In one embodiment, the auxiliary system can include several sensors, for example, a pressure sensor in the vapor container, a fluid level sensor in the liquid container, and a power sensor and a temperature sensor associated with the cooling controller. These sensors can provide real-time indicators that indirectly reflect the real-time heat load and cooling performance of the cooling system, natural conditions, and available resources. The real-time indicators as a whole may be considered by the cooling controller when regulating the operations of the multiple cooling tiers.

For example, even if that the cooling controller determines that the compressor needs to be started based on the pressure level of the vapor container and the fluid level of the liquid container, the cooling controller may delay the starting of the compressor if the ambient temperature is too high, which is anti-productive to vapor condensing. However, in another example, a high pressure level may directly trigger the compressor anytime to condense the vapor back to liquid. Since if the vapor is two high (e.g., above a threshold), the vapor container may no longer be able to sustain additional vapor soon. Thus, then condensing is needed even the ambient temperature is high.

In one embodiment, the auxiliary system is agnostic about the IT load. However, the auxiliary system relies on the pre-created profile of the IT load, which can be generated based on heat loads of the IT load, specifications of hardware in the cooling system, and desired cooling performance metrics.

The IT load can be an immersion cooling system or a server rack with regular liquid and air cooling. The immersion cooling system can include multiple immersion tanks, each immersion tank with electronic components at least partially submerged in a two-phase change coolant, and the server rack can be populated with multiple server chassis, each server chassis including multiple servers.

Each server includes electronic devices such as one or more processors, memory, a storage device, etc. that may generate heat during normal operations. In the regular liquid cooling configuration, each of the major electronic devices (e.g., a processor) may be attached to a cooling plate such as a cold plate, where the cold plate includes a liquid distribution channel therein to allow the cooling liquid to flow through, which in turn exchanges heat generated from the electronic device attached thereon. In the immersion cooling configuration, the electronic devices are at least partially submerged into dielectric fluid contained in an immersion tank. The cooling liquid can be two-phase cooling liquid, which can evaporate into vapor when the temperature of the liquid rises above a predetermined threshold.

In one embodiment, the auxiliary system is connected with a main system by vapor line and a liquid line, and can extend cooling capacity of the main system. The main system is always on, but the auxiliary system is turned on only when a vapor pressure in the vapor line reaches a threshold to trigger open a valve on the vapor line, which allows additional vapor from the IT load to reach the vapor container.

In one embodiment, multiple such main systems, each for cooling a separate IT load, can share the auxiliary system. Further, the auxiliary system can be connected with another auxiliary system that extends cooling capacity of one or more main systems. The connection between the two auxiliary systems allows each auxiliary system to share each other's compressor and condenser.

The embodiments described above are not exhaustive of all aspects of the present invention. It is contemplated that the invention includes all embodiments that can be practiced from all suitable combinations of the various embodiments summarized above, and also those disclosed in the Detailed Description below.

The various embodiments of the disclosure provide a control architecture for a cooling system with multiple cooling tiers, and that does not impact operations of an IT load or has real-time perception of the IT load variations. The advantages of the various embodiments include efficient use of phase change technology, accommodation of high variations of both heat load generations and cooling capacity, accommodation of the unbalance between the heat load and cooling capacity, cost reduction in the entire infrastructure, a simplified design, and operation efficiency.

FIG. 1 shows a multi-tier cooling system 100 according to one embodiment. The cooling system includes a main system 102, and an auxiliary system 105, which are in conjunction to cool an IT load 119. Although there is only one main system and one IT load shown, more IT loads and main systems may be applicable.

The IT load 119 can represent one or more server chassis of a server rack or one or more multiple immersion tanks. The IT load includes a phase change liquid coolant, which can transform into vapor due to rising of the temperature of the coolant resulted from the extracted heat from electronic components in the IT load 119.

The main system 102 includes a condenser 103, which is a heat exchanger (e.g., a liquid cooled condenser as shown in FIG. 1, and it can be an air cooled condenser) used to condense vapor from the IT load 119 to liquid through cooling. A cooling loop 106 can be attached to the condenser 103 to cool the condenser 103 using external coolant. The main system 102 is the default cooling system for the IT load 119, and is always activated as long as the IT load 119 is in operation. In one embodiment, condenser 103 is positioned above and near IT load 119, where IT load 119 may be maintained either in a regular server chassis or in an immersion tank.

A condenser is designed to transfer heat from a working fluid to a secondary fluid or the surrounding air. The condenser relies on the efficient heat transfer that occurs during phase changes, in this case during the condensation of a vapor into a liquid. The vapor typically enters the condenser at a temperature above that of the secondary fluid. As the vapor cools, it reaches the saturation temperature, condenses into liquid and releases large quantities of latent heat. As this process occurs along the condenser, the quantity of vapor decreases and the quantity of liquid increases; at the outlet of the condenser, only liquid retains.

The auxiliary system 105, however, does not operate all the time. Instead, the auxiliary system 105 is used to extend the cooling capacity of the main system 102. As such, the auxiliary system 102 is turned on only when the vapor pressure from the IT load 119 reaches a preset threshold. When the threshold is reached, a valve 115 on a vapor line connecting the main system 102 and the auxiliary system 105 can be turned on to allow vapor from the IT load 119 to be elevated to a vapor container 113 to buffered therein, thus extending the cooling capacity of the cooling system 100.

In one embodiment, the auxiliary system 105 can include multiple cooling tiers. The first cooling tier includes the vapor container 113, a valve 118, and a condenser 112, which form a direct vapor condensing path. The valve 118 can control the speed or volume at which the vapor container 113 release vapor to the condenser 112. The second cooling tier is a cooling loop 110 with a fluid pump 108. The third cooling tier includes the vapor container 113, a compressor 111, and the condenser 112, which form an indirect vapor condensing path. In this path, the vapor released from the vapor container 113 is to be passed to the compressor 111, which compresses the vapor to increase the temperature and pressure of the vapor before being delivered to the condenser.

The condenser 112 can condense the vapor released from the vapor container 113 directly or indirectly into liquid, which is stored in a liquid container 109. The liquid in the liquid container 109 can be distributed back to the IT load 119 due to the gravity via a valve 117, which can regulate the flow rates of liquid distributed back to the IT load 1119. In one embodiment, a pump may be needed when the liquid has a high viscosity.

In one embodiment, a cooling controller 108 can obtain a pressure level of the vapor container 113 via a pressure sensor 104, and a fluid level of liquid container 109 via a fluid level sensor 114. The cooling controller 107 can control the operation of the three cooling tiers described above based solely on the fluid level in the liquid container 109 and/or pressure level in the vapor container 113.

For example, when the vapor pressure in the vapor container 113 reaches a preset threshold, the cooling controller 107 can increase the opening of the valve 118 to allow more vapor to be released to the condenser 112. Alternatively, or additionally, the cooling controller 107 can adjust the frequency of the compressor 111 to improve compression performance, for example, increasing the cubic feet per minute (CFM) or the pounds per square inch (PSI) with the increasing of cycles per minutes of the compressor 111. The cooling controller 107 can also adjust the speed of the fluid pump 108 to increase the cooling capacity of the condenser 111. The cooling controller 107 can adjust the operations of the valve 118, the fluid pump 108 and the compressor 111 as described based solely on the pressure level in the vapor container without considering the fluid level in the liquid container 109.

Similarly, the cooling controller 107 can adjust the operation of the valve 118, the fluid pump 108 and the compressor 111 as described above based solely on the fluid level in the liquid container.

In one embodiment, the cooling controller 107 can also obtain the ambient temperature via an ambient temperature sensor 106 and the level of a renewable power source via a power sensor 116. The ambient temperature can be used to determine the opening of the value 118. For example, when the ambient temperature is low, the opening of the valve 118 can be increased to allow more vapor to be released to the condenser 109. When the ambient temperature is low, the condenser 109 can have better performance.

The level of the renewable power source can be used to determine the frequency of the compressor 111, which is powered by the renewable power source. When the level of the renewable power source is above a threshold, the cooling controller 107 can increase the frequency of the compressor 111. When the level of the renewable power source is below the threshold, the frequency of the compressor 111 can be decreased. Such a configuration is to ensure that the auxiliary system 105 does not run out of power necessary for the normal operation of the compressor 111. In one embodiment, the cooling controller 107 can also adjust the opening of the vapor line valve 115 and/or the liquid line valve 117 based on a profile of the IT load 119.

As such, the cooling controller 107 takes a holistic view of the whole system including the main system 102 and the auxiliary system 105 to optimize the cooling performance of the multi-tier cooling system 100.

In one embodiment, a machine learning model, for example, a neural network model, can be trained based on data collected from each and every component in the auxiliary system 105, as well as the vapor line valve 115, the liquid line valve 117, and the IT load 119.

In one embodiment, data collected from the IT load 119 can be used to generate profiles of the IT load 119. The data can include data on cooling hardware, electronic components to be cooled, and desired performance by users. An example of an IT load profile can include a heat load generated, and a cooling capacity required. However, the IT load profile may not reflect a real-time output (vapor) and input (liquid) requirement, but rather being calculated from data from the IT load 119 over a period of time.

The machine learning model can be used in real time to regulate the operation of the auxiliary system, including the operation of the valve 118, the compressor 111, and the fluid pump 108 as well as the vapor line valve 115 and the liquid line valve 117, based on the IT load profile, and real-time data collected by the multiple sensors 104, 106, 116, and 114.

In one embodiment, condenser 103 may be located within the electronic rack within which IT load 119 is located. Alternatively, condenser 103 may be located external to the electronic rack, where IT load 119 is fluidly coupled to condenser 103 via a vapor supply line and a liquid return line. In one embodiment, condenser 103 is positioned elevated with respect to IT load 119, such that the vapor generated from the IT load 119 can move upstream due to gravity via the vapor supply line. Similarly, the liquid generated from condenser 103 by condensing the vapor flows downwardly due to gravity to IT load 119 via the liquid return line. When valve 115 is open, which may be controlled by controller 107 or due to the vapor pressure on the vapor line, the vapor from IT load 119 can travel upstream to vapor container 113 of auxiliary system 105. Similarly, when valve 117 is open, which may be controlled by controller 107 or due to the liquid level in IT load 119, the liquid can flow from liquid container downstream to IT load 119. The auxiliary system 105 may be located outside of the electronic rack and may be shared with another electronic rack similar to the one as shown in FIG. 1.

Figure 2:
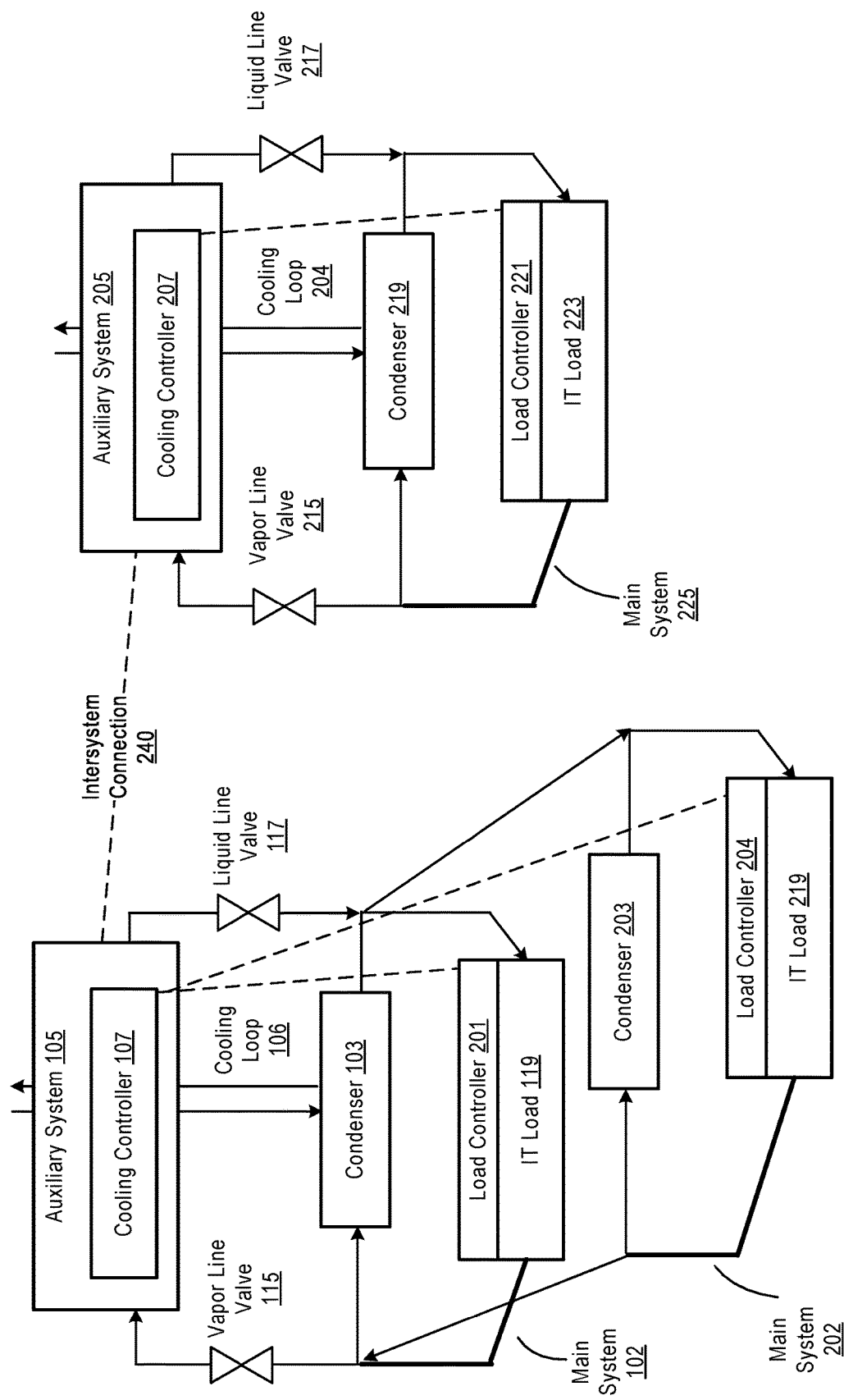
FIG. 2 illustrates another embodiment of the multi-tier cooling system.

FIG. 2 illustrates another embodiment of the multi-tier cooling system 100. As shown in FIG. 2, multiple multi-tier cooling systems can be connected together for redundancy and resilience. FIG. 2 uses a first multi-tier cooling system (left) and a second multi-tier cooling system (right) to illustrate the technical details of this embodiment.

In the first multi-tier cooling system, two main systems 102 and 202 share one auxiliary system 105. Vapor generated by an IT load 219 can be condensed back to liquid by a condenser 203 in the main system 202, and can also be elevated to the auxiliary system 105 via the vapor line valve 115. Liquid from the auxiliary system 105 can be distributed via the liquid line valve 117 to both the IT load 119 and the IT load 219.

In the second multi-tier cooling system, which resembles the cooling system 100 described in FIG. 1, vapor generated from the IT load 223 is condensed back to liquid by a condenser 219 in the main system 225. The auxiliary system 205 is connected to the main system 225 via a vapor line valve 215 and a liquid line valve 217. The condenser 219 can be cooled by a cooling loop 204. Further, a cooling controller 207 can implement a machine learning model to regulate the operation of various components in the auxiliary system 205 to achieve optimal cooling efficiency.

As shown, the auxiliary system 105 and the auxiliary system 205 can be connected via an intersystem connection 240 such that the two auxiliary systems may share each other's compressor and condenser. The intersystem connection 240 can function as a fourth cooling tier. As described above in FIG. 1, the first cooling tier includes the vapor container 113, a valve 118, and a condenser 112; the second cooling tier includes the cooling loop 110 with a fluid pump 108; and the third cooling tier includes the vapor container 113, a compressor 111, and the condenser 112.

In one embodiment, each of the IT loads 119, 219, and 223 can be associated with one of load controllers 201, 204, and 221. The cooling controllers 107 and 207 can obtain real-time information of the IT loads 119, 219, and 223 via the load controllers 201, 204, and 221. The cooling controllers 107 and 207 may consider the real-time IT load information only when the fourth cooling tier (i.e., the intersystem connection 240) is turned on.

When the fourth cooling tier is turned off, each multi-tier cooling system only uses a corresponding pre-created IT load profile and some real-time indicators to regulate the operation of various components in the respective auxiliary system. In an alternative embodiment, when the fourth cooling tier is turned off, the cooling controllers 107 and 207 may stop collecting real-time IT load information from the load controllers 201, 204, and 221.

Figure 3:
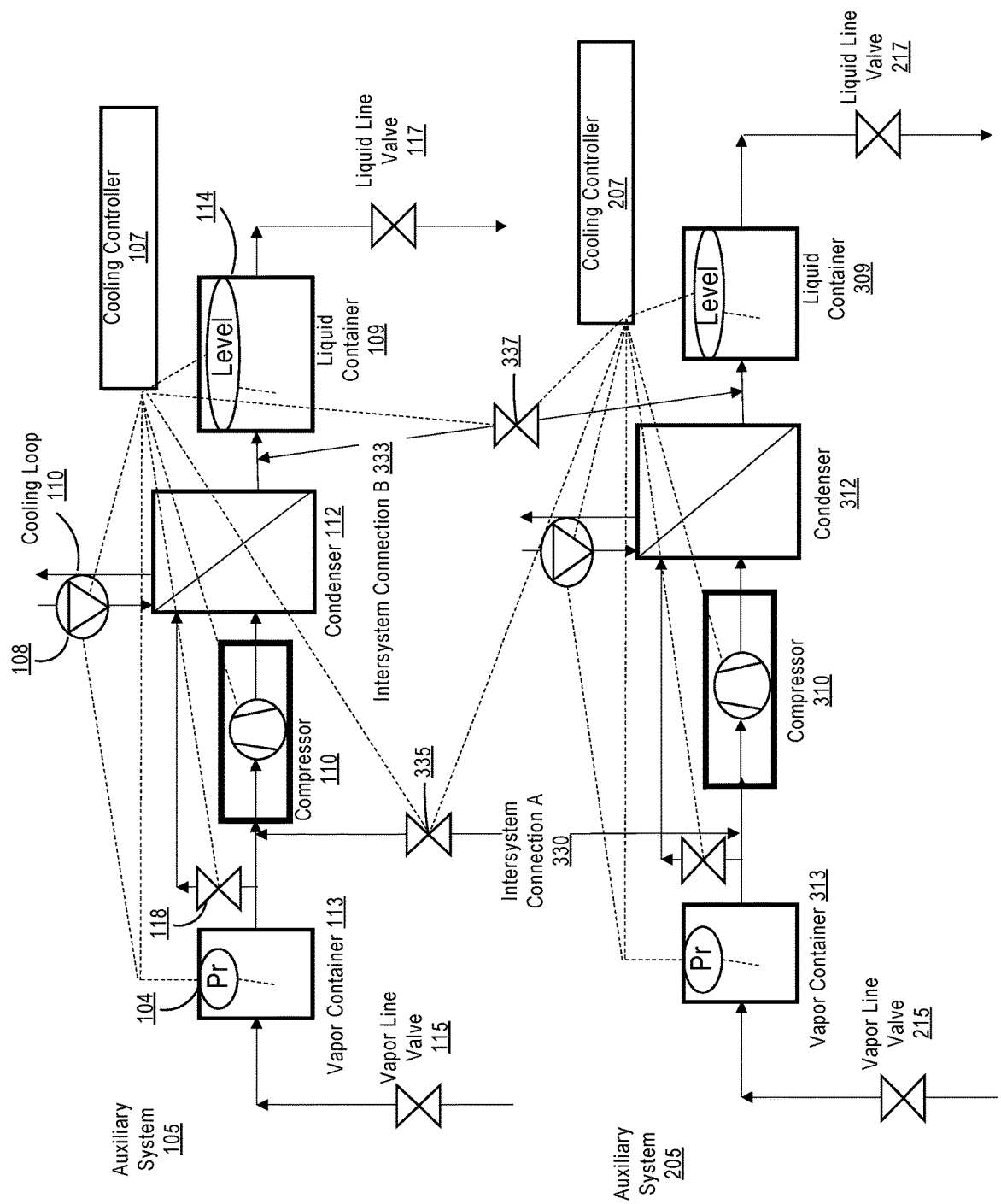
FIG. 3 further illustrates an intersystem connection and communication according to one embodiment.

FIG. 3 further illustrates the intersystem connection 240 according to one embodiment. More specifically, FIG. 3 shows an example of an implementation of the intersystem connection 240.

As shown, the interconnection 240 can be implemented by two intersystem connections 330 and 337. Intersystem connection A 330 connects two vapor line segments in the auxiliary systems 105 and 205, with the first vapor line segment between the vapor container 113 and the compressor 110 in the auxiliary system 105, and the second vapor line segment between the vapor container 313 and the compressor 310 in the auxiliary system 205. Intersystem connection A 330 enables vapor released from each of the vapor containers 113 and 313 to be compressed by both compressors 110 and 310. A valve 335 can be used by both of the cooling controllers 107 and 207 to control the volume of vapor passed between the auxiliary systems 105 and 205.

Intersystem connection B 333 can connect two liquid line segments in the auxiliary systems 105 and 205, with the first liquid line segment between the condenser 112 and the liquid container 109, and the second liquid line segment between the condenser 312 and the liquid container 309. Intersystem connection B 333 enables liquid from each of the condensers 112 and 312 to be stored in both of the liquid containers 109 and 309. A valve 337 can be used by both of the cooling controller 107 and 207 to control the volume or flow rates of liquid passed between the two auxiliary systems 105 and 205.

Thus, the configurations described above can improve the operation efficiency of the multi-tier cooling systems by providing redundancy, resilience, and cooling resources sharing, even though the vapor containers 113 and 313 and the liquid containers 109 and 309 are not directly connected.

In one embodiment, since each of the valves 335 and 337 on the intersystem connections 330 and 333 is directly controlled by both cooling controllers 107 and 207, each intersystem connection requires two-way system enabling, which means that each of the auxiliary systems 105 and 205 is configured to support resource sharing with another auxiliary system.

In one embodiment, the two intersystem connections 330 and 333 can be separately controlled and operated, meaning that the operation of each intersystem connection is independent of the other.

In one embodiment, the cooling controllers 107 and 207 can be combined into one, which can regulate the operations of the three cooling tiers in each of the auxiliary systems 105 and 205, and the shared fourth cooling tier (i.e., the intersystem connections 330 and 333) based on data obtained by various sensors of both auxiliary systems 105 and 205.

Figure 4:
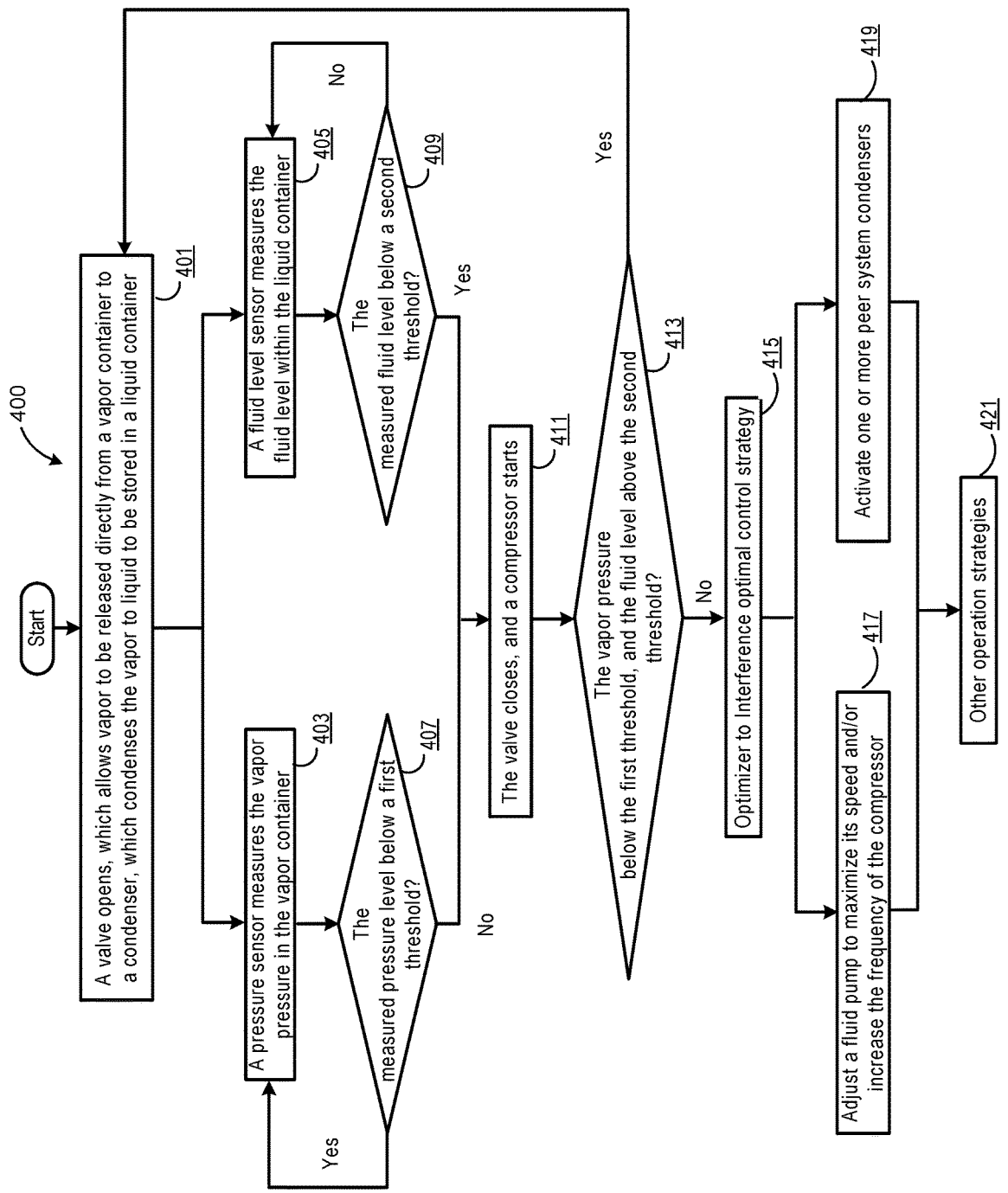
FIG. 4 is a flow chart illustrating a process of cooling an IT load according to one embodiment.

FIG. 4 is a flow chart illustrating a process 400 of cooling an IT load according to one embodiment. The flow chart shows a process in an auxiliary system, which extends cooling capacity of a main system used to cool the IT load. The auxiliary system includes a vapor controller, a vapor valve, a compressor, a condenser, and a liquid controller. The auxiliary system further includes a cooling controller implemented as a machine learning model for regulating the various cooling tiers based on an IT load profile, and real-time information collected from various sensors.

The process illustrated in FIG. 4 occurs in a single auxiliary system, which extends cooling capacity of a main system used to cool the IT load.

As shown in FIG. 4, at block 401, the cooling controller opens a vapor valve to allow vapor stored in the vapor container to be released directly to the condenser, which condenses the vapor to liquid to be stored in the liquid container.

At block 403, the cooling controller receives information from a pressure sensor in the vapor container that indicates a pressure level in the vapor container.

At block 407, the cooling controller determines whether the pressure level is below a first threshold. If the pressure sensor is below the first threshold, the cooling controller will continue monitoring the pressure level of the vapor container via the pressure sensor.

In parallel with collecting information from the pressure sensor and determining whether the pressure level is below the first threshold, the cooling controller collects, from a fluid level sensor in the liquid container, information indicating the fluid level of the liquid container (block 405), and determines whether the fluid level is below a second threshold (block 409). If the fluid level is not below the second threshold, the cooling controller will continue monitoring the fluid level of the liquid container via the fluid level sensor.

At block 411, upon determining that the pressure level is not below the first threshold, and that the fluid level is below the second threshold, the cooling controller closes the vapor valve, and starts the compressor, because with such a pressure level and such a fluid level, the heat load from the IT load has accumulated to a level that needs to be addressed by the second cooling tier, which includes the vapor container, the compressor, and the condenser. In this embodiment, the speed of the fluid pump for the condenser can be also be increased. Thus, the second cooling tier and the third cooling tier can be adjusted for different scenarios.

At block 413, with the cooling operations described at block 411, the heat load that needs to be addresses is expected to decrease. Thus, if the vapor pressure in the vapor container has fallen below the first threshold, and that the fluid level has risen above the second threshold, the auxiliary system can determine the heat load has decreased, and that the auxiliary system has additional cooling capacity. Therefore, as shown at block 413, in such a scenario, the auxiliary system can repeat the operation at block 401—opening the vapor valve to release vapor from the vapor container to the compressor. However, if, with the cooling operations described at block 411, the vapor pressure in the vapor container is still not below the first threshold, and the fluid level in the liquid container is still not above the second threshold, the auxiliary system can determine that those operations are insufficient to handle the heat load. Therefore, additional operations need to be triggered.

At block 415, the cooling controller uses an optimizer (e.g., a trained machine learning model) to optimize cooling operations, including adjusting a fluid pump to maximize its speed and/or increasing the frequency of the compressor at block 417, and/or activating one or more peer system condensers at block 419. In addition, an optimized operation may also include a combination of operation of cooling tier 2 and tier 3.

At block 421, additional operation strategies may be used if the cooling performance is still not ideal after all four cooling tiers have been activated.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

What is claimed is:

1. A cooling system, comprising:
a main system positioned above an information technology (IT) load, wherein the main system includes a main condenser to receive vapor from the IT load, condense the received vapor into liquid, and distribute the liquid back to the IT load; and
an auxiliary system, positioned above the IT load and above the main system, the auxiliary system including:
a vapor container connected to the IT load via a vapor line,
an auxiliary condenser to receive vapor from the vapor container via a compressor, and to condense the vapor into liquid to be stored in a liquid container; and
a cooling controller to regulate a vapor valve on the vapor line based on a vapor pressure in the IT load to control a volume of vapor passed from the IT load to the vapor container, and regulate the compressor based on operating states of the vapor container and the liquid container.

2. The cooling system of claim 1, wherein the cooling controller includes a machine learning model to regulate at least one of a speed of a fluid pump, a frequency of the compressor, or an opening of the vapor valve.

3. The cooling system of claim 1, wherein the vapor container includes a pressure sensor for measuring a pressure level of the vapor contained in the vapor container, wherein the cooling controller is configured to control the vapor valve, a fluid pump, and the compressor based on the pressure level of the vapor container.

4. The cooling system of claim 1, wherein the liquid container includes a fluid level sensor for measuring a liquid level of the liquid container, wherein the cooling controller is configured to control the vapor valve, a fluid pump, and the compressor based on the liquid level of the liquid container.

5. The cooling system of claim 1, wherein the cooling controller further determines, using a power sensor, an available power level of a renewable power source for powering the cooling controller.

6. The cooling system of claim 1, wherein the cooling controller further determines, via a temperature sensor, an ambient temperature, wherein the cooling controller is to start the compressor when the ambient temperature falls below a threshold.

7. The cooling system of claim 1, wherein the IT load is designed with an immersion based cooling system with a plurality of immersion tanks, with electronics at least partially immersed in a two phase immersion fluid.

8. The cooling system of claim 1, wherein the vapor container and the liquid container in the auxiliary system operates in an asynchronized manner.

9. The cooling system of claim 1, wherein the auxiliary system and the main system are connected by the vapor line and a liquid line.

10. The cooling system of claim 9, wherein the liquid line is regulated by a liquid line valve to control a volume of liquid distributed from the liquid container to the IT load.

11. The cooling system of claim 1, wherein the vapor line valve is opened when a pressure level of in the vapor line reaches a threshold.

12. The cooling system of claim 1, wherein the main system is a first main system and the IT load is a first IT load, and wherein the cooling system further comprises a second main system coupled to the auxiliary system and the second main system is configured to provide cooling to a second IT load.

13. The cooling system of claim 12, wherein the auxiliary system is shared by the first main system and the second main system.

14. A data center cooling system, comprising:
a plurality of cooling systems, each corresponding to an information technology (IT) load, wherein each of the plurality of cooling systems comprises:
a main system positioned above a corresponding IT load, wherein the main system includes a main condenser to receive vapor from the IT load, condense the received vapor into liquid, and distribute the liquid back to the IT load; and
an auxiliary system, positioned above the IT load and above the main system, the auxiliary system including:
a vapor container connected to the IT load via a vapor line,
an auxiliary condenser to receive vapor from the vapor container via a compressor, and to condense the vapor into liquid to be stored in a liquid container; and
a cooling controller to regulate a vapor valve on the vapor line based on a vapor pressure in the IT load to control a volume of vapor passed from the IT load to the vapor container, and regulate the compressor based on operating states of the vapor container and the liquid container.

15. The data center cooling system of claim 14, wherein cooling controllers of at least two of the plurality of cooling systems are communicatively coupled to each other.

16. The data center cooling system of claim 14, wherein an auxiliary condenser of an auxiliary system of a first cooling system of the plurality of cooling systems is shared by an auxiliary system of a second cooling system of the plurality of cooling systems.

17. The data center cooling system of claim 14, wherein the vapor container includes a pressure sensor for measuring a pressure level of the vapor contained in the vapor container, wherein the cooling controller is configured to control the vapor valve, a fluid pump, and the compressor based on the pressure level of the vapor container.

18. The data center cooling system of claim 14, wherein the liquid container includes a fluid level sensor for measure a liquid level of the liquid container, wherein the cooling controller is configured to control the vapor valve, a fluid pump, and the compressor based on the liquid level of the liquid container.

19. The data center cooling system of claim 14, wherein the cooling controller further determines, using a power sensor, an available power level of a renewable power source for powering the cooling controller.

20. The data center cooling system of claim 14, wherein the cooling controller further determines, via a temperature sensor, an ambient temperature, wherein the cooling controller is to start the compressor when the ambient temperature falls below a threshold.

\* \* \* \* \*